(12) United States Patent
Frijlink

(10) Patent No.: US 11,527,440 B2
(45) Date of Patent: Dec. 13, 2022

(54) PROCESS FOR SEPARATING A PLATE INTO INDIVIDUAL COMPONENTS

(71) Applicant: OMMIC, Limeil-Brevannes (FR)

(72) Inventor: Peter Michael Frijlink, Yerres (FR)

(73) Assignee: OMMIC, Limeil-Brevannes (FR)

( * ) Notice: Subject to any disclaimer, the term of this patent is extended or adjusted under 35 U.S.C. 154(b) by 0 days.

(21) Appl. No.: 17/271,925

(22) PCT Filed: Aug. 23, 2019

(86) PCT No.: PCT/FR2019/051955
§ 371 (c)(1),
(2) Date: Mar. 12, 2021

(87) PCT Pub. No.: WO2020/043981
PCT Pub. Date: Mar. 5, 2020

(65) Prior Publication Data
US 2021/0343593 A1    Nov. 4, 2021

(30) Foreign Application Priority Data
Aug. 27, 2018  (FR) ...................................... 1857666

(51) Int. Cl.
*H01L 21/78* (2006.01)
*H01L 21/683* (2006.01)

(52) U.S. Cl.
CPC .......... *H01L 21/78* (2013.01); *H01L 21/6835* (2013.01); *H01L 2221/68318* (2013.01);
(Continued)

(58) Field of Classification Search
CPC ................. H01L 21/78; H01L 21/6835; H01L 2221/68318; H01L 2221/68327; H01L 2221/68381; H01L 2221/6834
(Continued)

(56) References Cited

U.S. PATENT DOCUMENTS 9,330,976 B2 * 5/2016 Yakoo ............... H01L 21/67132
10,607,877 B2 * 3/2020 Lee ......................... H01L 33/62
(Continued)

FOREIGN PATENT DOCUMENTS

WO       2008/005979       1/2008

OTHER PUBLICATIONS

International Search Report for PCT/FR2019/051955 dated Dec. 13, 2019, 5 pages.
(Continued)

*Primary Examiner* — Vu A Vu
(74) *Attorney, Agent, or Firm* — Nixon & Vanderhye

(57) ABSTRACT

Disclosed is a method for separating a plate into multiple individual detached components or cutting the plate into chips. The back end process for a plate includes providing a substrate; attaching the plate to the substrate using a sacrificial layer that is made of materials that in a solid state at ambient temperature and ambient pressure, and having a transformation temperature into one or more gaseous compounds at ambient pressure of between 80° C. and 600° C.; and separating the plate attached on the substrate into a plurality of plate portions; increasing temperature and/or reducing surrounding pressure to transform the sacrificial layer into one or more gaseous compounds.

20 Claims, 5 Drawing Sheets

(52) U.S. Cl.
CPC ............... *H01L 2221/68327* (2013.01); *H01L 2221/68381* (2013.01)

(58) Field of Classification Search
USPC ........................................................ 438/464
See application file for complete search history.

(56) References Cited

U.S. PATENT DOCUMENTS

| 2008/0003780 | A1* | 1/2008 | Sun ..................... H01L 21/6836 438/464 |
| 2010/0233867 | A1 | 9/2010 | Akiyama et al. |
| 2016/0035616 | A1 | 2/2016 | Cheng et al. |

OTHER PUBLICATIONS

Written Opinion of the ISA for PCT/FR2019/051955 dated Dec. 13, 2019, 6 pages.

* cited by examiner

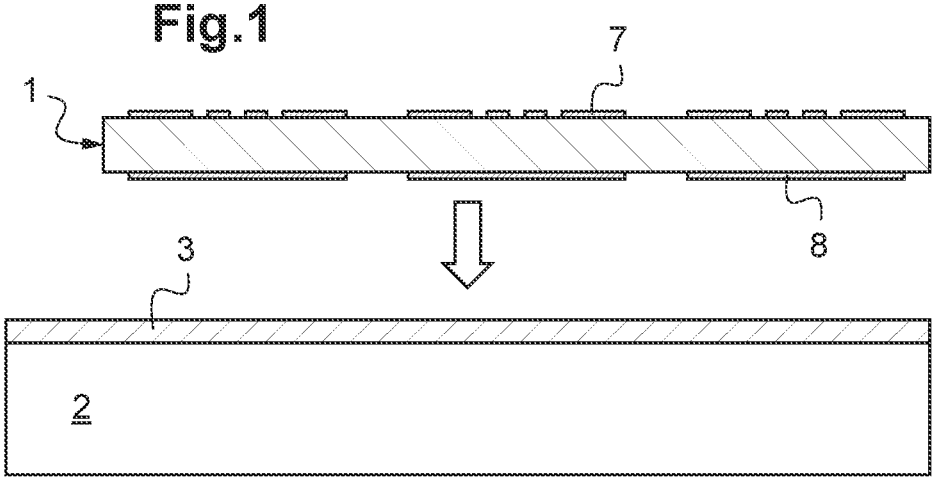
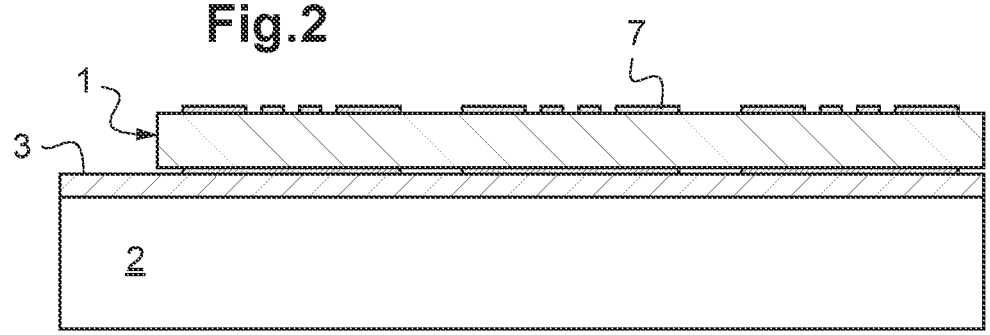
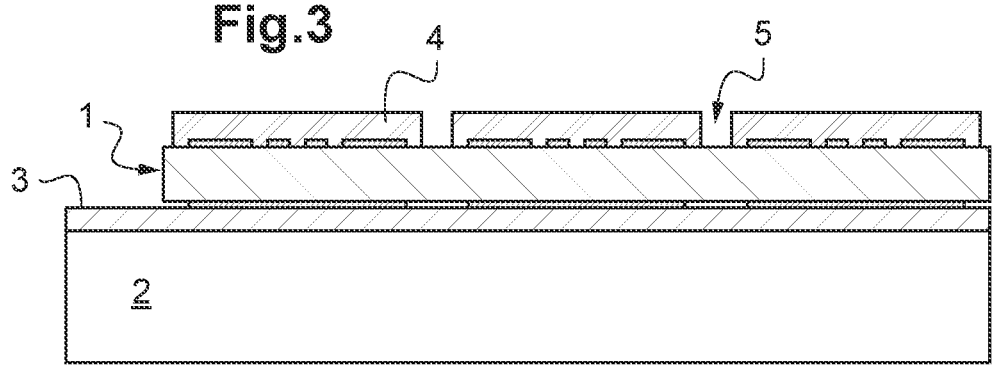

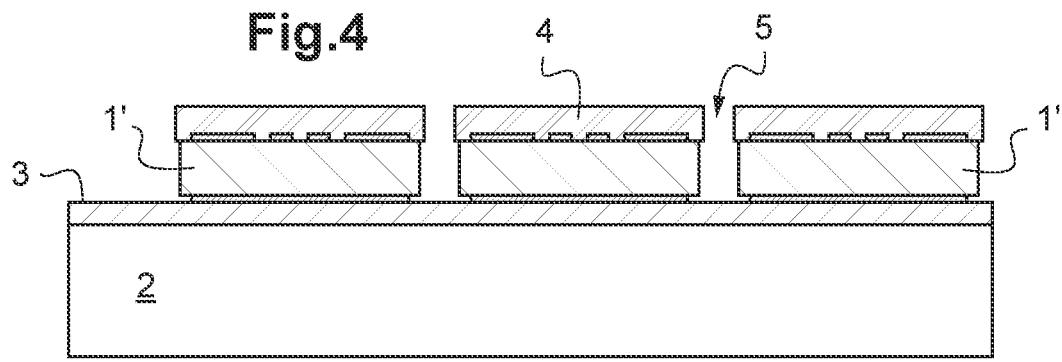
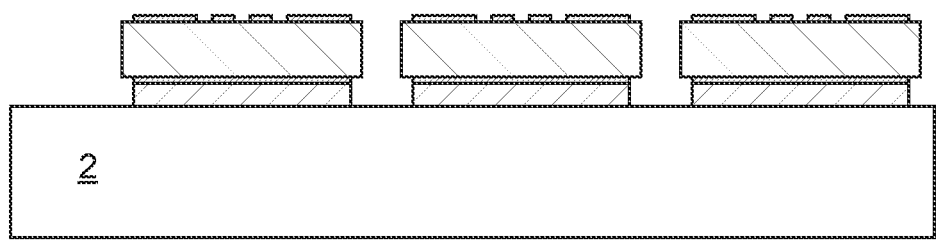
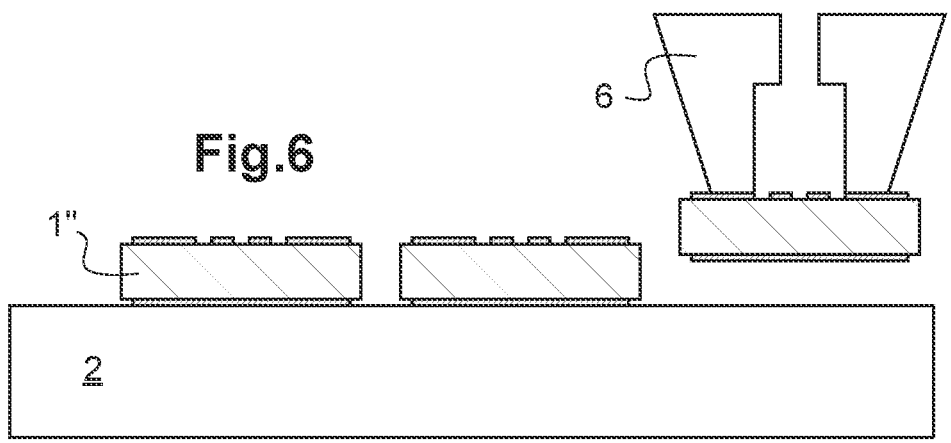

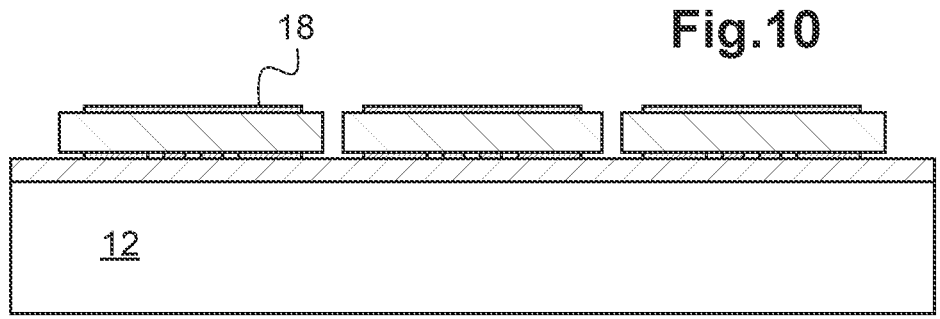
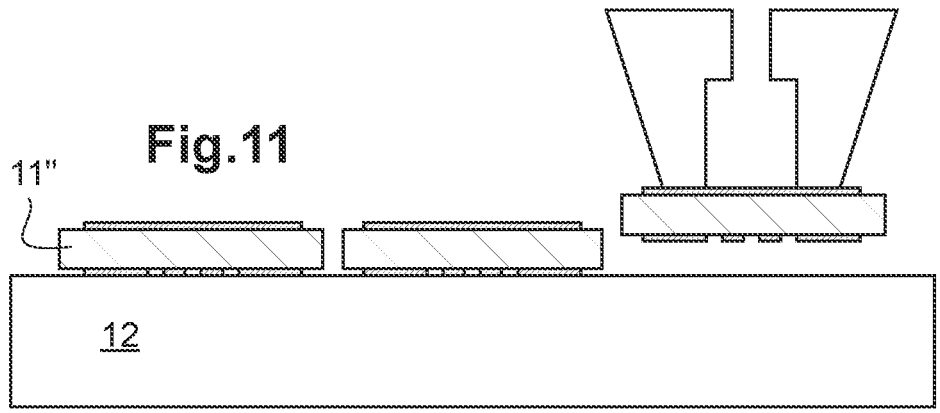

PROCESS FOR SEPARATING A PLATE INTO INDIVIDUAL COMPONENTS

CROSS-REFERENCE TO RELATED APPLICATION

This application is the U.S. national phase of International Application No. PCT/FR2019/051955 filed Aug. 23, 2019 which designated the U.S. and claims priority to FR Patent Application No. 1857666 filed Aug. 27, 2018, the entire contents of each of which are hereby incorporated by reference.

BACKGROUND OF THE INVENTION

Field of the Invention

The invention concerns the separation of a plate into a plurality of individual detached components ("chip singulation"), or cutting the plate into chips ("wafer dicing").

Description of the Related Art

Conventionally, a plate is made by depositing, on a wafer, a stack of layers of semiconductor, metal or the like, for example a channel layer, a barrier layer, etc. It is known to structure these layers by means of lithography, in order that the chips can fulfil the functionality defined by the specifications.

Back end processes are then envisaged.

Among the back end processes, a test step can identify possible defective chips or classify the chips according to various specifications. The measurements performed during this test step involve physical contact with the plate.

The singulation is then performed, in other words the plate obtained is diced into a plurality of individual components.

To accomplish this, the plate is placed on a flexible, elastic, stretchable and sticky dicing film, and the assembly is installed on a vacuum table equipped with a suction system. The suction via the orifices defined in the vacuum table, holds the assembly during the actual dicing.

The dicing can be carried out by sawing, however dicing by grooving and cleaving, laser dicing and dicing by etching are also known.

In the case of laser dicing, it is optionally possible to remove the protective layers and perform a cleaning.

In the case of dicing by sawing, cleaning is carried out using water ("thorough water jet cleaning").

The individual components are then detached from the dicing film.

The plate can have a thickness of order 100 μm, this thickness tends to decrease with the miniaturisation of components and the increase in the frequencies of electrical signals in new fields of application. Plates of thickness 25 or 50 μm are already encountered.

However, the thinner the plate, the greater the risk of damaging, or even breaking, the plate during these back end processes, which imposes more constraints, in particular in terms of handling.

In particular, the measurements carried out before dicing and detachment may no longer be entirely valid. This can lead to financial losses and loss of reliability when these chips are then mounted in subassemblies.

SUMMARY OF THE INVENTION

There is therefore a need for a process for separating a plate into individual components which is less constraining.

It is proposed a back end process for a plate, in order to obtain a plurality of individual detached electrical, optical or optoelectronic components, comprising:

a) providing a substrate, b) attaching the plate to the substrate by means of a sacrificial layer between this plate and this substrate, the sacrificial layer being made of one (or more) material(s) that is (are) in a solid state (advantageously rigid) at ambient temperature and ambient pressure, and having a transformation temperature into one or more gaseous compounds at ambient pressure of between 80° C. and 600° C., c) separating the plate attached on the substrate into a plurality of plate portions, d) increasing the temperature and/or reducing the surrounding pressure to a sufficiently high temperature and/or a sufficiently low pressure, respectively, in order to transform the sacrificial layer attached to the plurality of plate portions into one or more gaseous compounds.

In the course of step c), the separation of the plate into a plurality of plate portions can be carried out so as to leave the substrate as a single piece. In other words, the separation does not affect the substrate.

Step d) can be carried out while the plurality of plate portions is attached to a single-piece substrate (a single substrate for a plurality of plate portions). The transformation of the sacrificial layer into gaseous components leaves the plurality of plate portions on this substrate.

Thus, rather than a flexible, elastic, stretchable and sticky dicing film, a sacrificial layer is used which is relatively simple to eliminate, which can facilitate the back end processes (for example measurements, dicing steps, transport steps, etc.).

With the method described above, the elimination of the sacrificial layer can be relatively simple to carry out, in the sense that it suffices for example to heat the material or materials of the sacrificial layer to a sufficiently temperature, the material(s) of the sacrificial layer then being removed from the assembly by transformation into one or more compounds in the gaseous state.

Surprisingly, once the sacrificial layer is transformed, the individual components can lightly adhere to the substrate, this adhesion being sufficiently high that the assembly of substrate plus individual components can be transported easily, and at the same time is sufficiently weak that each component can be grasped and detached from the substrate without the risk of damaging it.

In addition, once the sacrificial layer has been transformed, the location of the components is known, and this even if the assembly of substrate plus components has been transported. It is thus also no more necessary to have shape recognition tools available, in order to perform the grasping of the components.

In certain cases, it will then even be possible to carry out electrical measurements on the components in order to sort them according to various specifications, and the information obtained will then permit sorting of the chips during sampling, which will be representative of the final state of the chips.

In addition, there may no longer be any trace remaining of this sacrificial layer on the components. Insofar as the sacrificial material or materials used completely transform into one or more gaseous components by decomposition, sublimation or vaporisation, when, after the separation into chips and optional associated clean, the temperature is raised to above that of the transformation temperature, the cleaning of the individual detached chips is no longer necessary.

Further, the invention may make it possible to avoid the step of illumination with ultraviolet radiation which is carried out in the prior art in order to reduce the adhesion of the flexible and sticky dicing film. In the prior art, this step takes place after the dicing, in order that the adhesion remains high during separation, but before grasping of the components, in order to facilitate the detachment of the flexible dicing film. In this case, under practical conditions in the prior art, a residual adhesion always remains, which makes detachment of thin and fragile chips risky, particularly when it is necessary to avoid bending the chips in order not to damage their structures. The invention may make it possible to reduce the adhesion of the chips to the substrate to a much lower value. This can be particularly advantageous for chips with thickness less than 100 µm, and when the chips are produced from materials which cleave easily, such as GaAs or InP for example.

Insofar as the assembly formed by the sacrificial layer and the substrate is more rigid than the dicing film of the prior art, the invention may make easier to perform, on a very thin plate, all the conventional technological manufacturing operations, after thinning, such as lithography, deposition of resins, photo-exposure, resin development, deposition of material layers, etching, stripping and cleaning, with a reduced risk of cleavage of the plate, provided that the temperature during the operation remains less than the transformation temperature of the sacrificial material. The sacrificial material may be chosen having a transformation temperature that is sufficiently high for this purpose, with the proviso that the components on the chips must not be degraded during the transformation.

Step d) can advantageously be carried out until eliminating (by transformation) more than 90% by mass of the material or materials of the sacrificial layer, advantageously more than 99%, advantageously all of this sacrificial layer.

The substrate can be flexible or rigid.

For example, in the case of a plate attached to a rigid substrate, it is possible to carry out the test steps on the plate while it is attached to the substrate via the sacrificial layer. The risk of damage linked to the measurements is therefore reduced due to the thickness of the assembly and the choice of a substrate with good mechanical solidity.

In certain cases, it is possible to carry out electrical measurements (allowing the chips to be classified) after the separation, because the chips are always attached to the substrate at the same fixed distances as they had before the separation. The classifications originating from these measurements may be more reliable than in the prior art.

The invention also facilitates the transport of the plate, because thanks to the rigidity provided by the substrate, the risk of deterioration is reduced. The invention can make it possible, in particular, to easily put in place measurements at remote sites, since transport is thus less risky, and do so in a relatively simple manner.

The invention can also significantly improve the yield.

Advantageously, once the plate is attached to the substrate, all the steps preceding separation step c) are carried out under temperature and pressure conditions such that the sacrificial layer remains solid.

Operations such as transport, measurements, mechanical dicing, etc. can be carried out at ambient temperature and pressure, in other words the sacrificial layer is thus solid.

The back end processes can thus advantageously comprise at least one process step carried out at ambient temperature and pressure, for example a measurement step, a transport step, a polishing step, a mechanical dicing step or the like.

Other operations such as laser dicing or the like may involve an (optionally local) increase in temperature and/or pressure. Care can then be taken to remain under conditions of temperature and pressure such that the sacrificial layer remains solid.

In order to eliminate the sacrificial layer, the temperature can be raised to the temperature for transformation into one or more gaseous compounds, or to a higher temperature.

Of course, if the step of eliminating the sacrificial layer is carried out at a pressure different from ambient pressure, it is possible to adapt the temperature in order to ensure the elimination of the sacrificial layer, in particular in the case of a transformation by sublimation or vaporisation.

The increase in temperature can thus be carried out jointly with a reduction in the surrounding pressure.

Alternatively, a vacuum can be generated, without increasing the temperature, in order to eliminate the sacrificial layer, in particular if the surrounding temperature is already high.

Advantageously, during step d), the temperature is increased to a temperature between 80° C. and 600° C., advantageously a temperature greater than 100° C., advantageously to 150° C., advantageously to 200° C.

This temperature can advantageously be less than 500° C., advantageously be less than 400° C., advantageously be less than 350° C.

Advantageously, this temperature can be in a range between 230° C. and 350° C.

The plate and the substrate can be chosen in such a way as to remain in the solid state when the temperature is increased.

The substrate can advantageously be reused.

At ambient pressure, the sacrificial layer can be transformed into one or more gaseous compounds at a temperature between 80° C. and 600° C., advantageously between 230° C. and 350° C.

Advantageously and in a non-limiting manner, the sacrificial layer has a transformation temperature into one or more gaseous compounds, at ambient pressure, greater than 100° C., advantageously greater than 150° C., advantageously greater than 200° C.

Advantageously and in a non-limiting manner, the sacrificial layer has a transformation temperature into one or more gaseous compounds, at ambient pressure, less than 500° C., advantageously less than 400° C., advantageously less than 350° C.

Advantageously, this transformation temperature into one or more gaseous compounds at ambient pressure, can be in the range between 230° C. and 350° C.

The ambient pressure may be between 50 kPa and 105 kPa, advantageously between 80 kPa and 105 kPa, for example equal to 101 kPa.

The ambient temperature may be between 0° C. and 50° C., advantageously between 15° C. and 35° C., for example between 20° C. and 25° C.

"Transformation into one or more gaseous compounds" is understood to mean both decomposition into one more gaseous compounds as well as evaporation or sublimation.

"Decomposition temperature" is understood to mean the temperature leading to the decomposition of half of the material in one hour.

The substrate can be sapphire, silicon, glass, metal or the like.

The substrate may or may not have a thickness less than a millimetre.

For the substrate, it is judicious to choose one (or more) material(s) that are resistant to the transformation temperature of the sacrificial layer into one or more gaseous compounds.

The plate can be rigid, or alternatively flexible. In the latter case, the plate and the substrate (for example a metal substrate) can, for example, be wound into a roll. This roll can have a profile diameter of order 60 cm, for example.

In the case of a flexible plate, laser dicing can be favoured for carrying out the separation step c).

The plate can have a thickness less than a millimetre, typically less than 200 µm, advantageously less than or equal to 100 µm.

The plate can comprise crystalline, semi-crystalline or amorphous materials, for example a semiconductor material, metal, dielectric material, glass, ceramic material, a polymer or other, a combination of these materials, for example in layers, a mixture of these materials, or other.

In the case of a semiconductor plate, the plate may, for example, essentially comprise (in other words more than 80% by mass) silicon Si, germanium Ge, gallium arsenide GaAs, indium arsenide InAs, indium phosphide InP, gallium phosphide GaP, gallium antimonide GaSb, indium antimonide InSb, silicon carbide SiC, gallium nitride GaN, aluminium nitride AlN, and/or diamond. These materials can be combined in layers, mixtures or other.

The wafer from which the plate originates can essentially comprise one or more of these materials.

These materials may or may not be doped.

In an embodiment, grooves can be hollowed out on one face of the plate before attachment of the plate to the substrate. The depth of these grooves does not reach the opposite face of the plate.

A groove depth can be envisaged which is equal to or slightly greater than the desired thickness for the chips when they are detached.

This groove-forming step can be carried out, for example, by etching, for example plasma etching, by laser, and/or mechanically, for example by means of a saw blade.

This groove-forming step can be relatively easy to carry out, since at this stage the plate can have a relatively high thickness, for example on the order of 600 µm or 800 µm.

The grooved plate can then be attached via the sacrificial layer to the substrate (step b)).

Advantageously and in a non-limiting manner, this attachment can be achieved with the grooved face on the side of the substrate, in other words the face defining the grooves is then on the substrate side.

It can be provided that in step c), the plate is then slightly hollowed out at the locations of the grooves, for example until the grooves are reached or else so as to allow easy cleaving, in order to separate the plate into plate portions.

However, advantageously, during the separation step c), the plate can be thinned via the face opposite the grooved face. This thinning can be obtained, for example, by lapping, by means of a grinding wheel, by polishing, by chemical etching, or other.

In an advantageous embodiment, the plate is thinned until the grooves are reached, so that the thinning leads to a separation of the plate into a plurality of plate portions.

Alternatively, the thinning can be stopped before the grooves are reached, in particular in the case of a later separation by cleaving. The separation can also be obtained by carrying out dicing on the thinned plate attached to the substrate, for example by means of a laser, etching or other. This dicing could be relatively shallow.

Advantageously, before detaching, while the chips are still attached to the substrate by the sacrificial layer, one or more process steps can be envisaged, for example in order to add components, carry out masking, etch via-holes, etc. When the substrate is rigid, the process steps can be relatively simple to carry out because the locations and alignments are relatively well controlled. These process steps can take place before or after the separation step.

Advantageously, separation step c) can comprise a step of dicing the plate attached to the substrate with the sacrificial layer, in particular when the plate has not been grooved.

In an embodiment, the dicing of the plate into chips can be carried out (or induced, in other words the dicing is followed by cleaving) mechanically, for example by means of a saw blade, in particular in the case of a rigid plate. Due to the support provided by the sacrificial layer and the substrate, the risk of breaking or damage linked to the dicing is reduced compared with the prior art in which the thin plate rests on a flexible, elastic and stretchable film.

A blade, for example of a circular-saw, can be arranged so that the depth of the dicing reaches the substrate, in particular in the case of a silicon substrate.

Alternatively, the blade can be arranged so as to reach the sacrificial layer only, in particular in the case of a sapphire substrate.

One can form a groove for example with a diamond, and then provide for cleavage.

In an embodiment, the dicing can be produced by etching.

For example, the plate could be covered with one (or more) masking material(s), in which openings are defined corresponding to the future contours of the components.

A single layer of photosensitive resin, for example, can be used for the masking.

In the case where a resin does not sufficiently resist the etching of the materials of the plate, it is possible to use a layer of a material that resists etching, such as a dielectric material, for example silicon oxide or silicon nitride, or a metal, such as nickel, for example. The openings in this material which delimit the chips can be obtained by photolithography using conventional means known to a person skilled in the art.

A step of removing the masking material or materials can advantageously be provided before increasing the temperature leading to the elimination of the sacrificial layer.

Wet chemical etching, photolithography or other can be provided.

Advantageously, the dicing can be carried out by means of plasma etching. The invention can avoid the constraints imposed by the flexible dicing film. Indeed, the majority of these flexible films are produced from materials which degrade when the temperature is raised above 100° C. or 150° C., in other words at temperatures that are easily attained during the application of a plasma.

In particular, in the case of a plate produced from a wafer of SiC, this plate can reach even higher temperatures during the application of a plasma, which, in the prior art, prohibits this type of dicing for this type of plate. This is all the more so since parts of the flexible dicing film would then be directly exposed to the plasma. The invention can thus make possible separation by plasma dicing of a plate originating from a SiC wafer.

In another embodiment, it is possible to perform a plurality of successive etchings, in particular in the case of a plate comprising a stack of layers. Each etching can correspond to one or more layers.

In another embodiment, the dicing can be carried out or induced by means of a laser. Here again, the invention can limit the stresses and deformations of the edges of the components, in particular in the case of a rigid sacrificial film.

It is possible, for example, to combine laser use and cleaving (induced dicing).

In an embodiment, the dicing can be carried out or induced by combining one or more etchings, laser dicing and/or mechanical dicing.

In an embodiment, step d) of increasing the temperature in order to eliminate the sacrificial layer, can be accompanied by a reduction in pressure, for example to 1000 Pa or less, in order to facilitate this elimination.

This method can further comprise a step of grasping the components thus obtained, for example by means of a rubber vacuum tool.

The invention makes it possible to perform this grasping without creating relatively high stresses, again limiting the risk of damage to the components. The known methods of the prior art, involving grasping the component resting on a flexible and generally relatively adhesive film, are likely to lead to damages which are sometimes not optically detectable, but which can affect the operation of the capacitances and transistors incorporated in the component.

In an embodiment, the sacrificial layer can be made of polymers, in other words can comprise at least 50%, advantageously at least 70% or 90% by mass of crude polymers, advantageously between 99% and 100% by mass of crude polymers.

These crude polymers can advantageously consist of, for example, more than 70% by mass, advantageously more than 90% by mass, advantageously between 99% and 100% by mass, of molecules of polypropylene carbonate, other polycarbonate molecules and/or polynorbornene molecules. In this case, it concerns polymers decomposing at a temperature between 80° C. and 600° C., and which during this decomposition transform completely into gaseous compounds, without residues.

In another embodiment, a material such as anthracene or camphor can be used as sacrificial material, which can be eliminated through sublimation by raising the temperature under reduced pressure, without residues.

It should be noted that the plate can be attached on its rear face (backside) to the substrate via the sacrificial layer, or even on its other face (front side). An attachment to the backside can have the advantage of facilitating access to the component on the front side, in particular during the test steps.

In an embodiment, the attachment of the plate to the substrate via the sacrificial layer can be carried out at a temperature greater than a glass transition temperature of the material or materials of the sacrificial layer, advantageously by applying a uniaxial pressure normal to the plate (for example of 10 or 30 N/cm$^2$) and/or under a surrounding pressure less than 50 kPa, advantageously under a high vacuum. A molecular attachment can thus be produced, in other words electrostatic forces, such as Van der Waals forces, participate in the attachment. This can be particularly advantageous in the case of a relatively low adhesive sacrificial layer material.

In the present application, "on" shall be understood to mean both "directly on" and "indirectly on", in other words to mean that a layer deposited on another can be in contact with this other layer, or can be separated from this other layer by one or more intermediate layers.

One or more sacrificial layers can be envisaged, provided that the set of at least one layer is in contact with the plate and with the substrate. In other words, the sacrificial layer in contact with the plate and the substrate, and the transformation of which to the gaseous state can cause the plate portions to adhere lightly to the substrate, can comprise a plurality of sublayers, for example a first sublayer made of a first material directly on the substrate and a second sublayer made of a second material, different from the first material, between the first sublayer and the plate, and in contact with the first sublayer of the plate.

This can be reworded by stating that the plate is attached to the substrate by a set of at least one sacrificial layer, in contact with the plate and with the substrate, and that this is the set which is produced in material or materials which are in a solid state (advantageously rigid) at ambient temperature and pressure, and having a transformation temperature to one or more gaseous compounds at ambient pressure of between 80° C. and 600° C., and that this is the set of at least one layer which is then transformed into one or more gaseous compounds.

The material or materials between the plate separated into plate portions and the substrate having been transformed into gaseous compounds, these plate portions are then directly on the substrate and, surprisingly, can adhere lightly to the substrate.

The invention is in no way limited by the manner in which the sacrificial layer is applied on the substrate. It could be envisaged, for example, to mix the one or more materials of the sacrificial layer with a solvent, in order to obtain a liquid that is deposited on the substrate. The solvent then evaporates, leaving in place the material or materials of the sacrificial layer. A spin coater can be used in order to obtain a layer having an equal thickness over the entire surface, such as is used for spreading photosensitive resins on plates in the semiconductor industry.

Advantageously, the substrate can have a lateral expansion coefficient equal or close to (relative difference of less than 5%) the lateral expansion coefficient of the plate. Hence, during the temperature increase required by various technological operations and during the temperature increase performed in order to eliminate the sacrificial layer and/or during a temperature increase during measurements, the creation of stresses on the plate which could lead to its cleaving, or which could cause an early delamination of the substrate/sacrificial layer/plate assembly, is avoided.

BRIEF DESCRIPTION OF THE DRAWINGS

The invention will be better understood with reference to the figures, which illustrate non-limiting embodiments given by way of example.

FIGS. 1 to 6 are sectional and very schematic views, illustrating an example of the process according to an embodiment of the invention.

FIGS. 7 to 11 are sectional and very schematic views, illustrating an example of the process according to another embodiment of the invention.

DESCRIPTION OF THE PREFERRED EMBODIMENTS

Identical reference signs are used from one figure to another in order to designate identical or similar elements.

Figure 12:
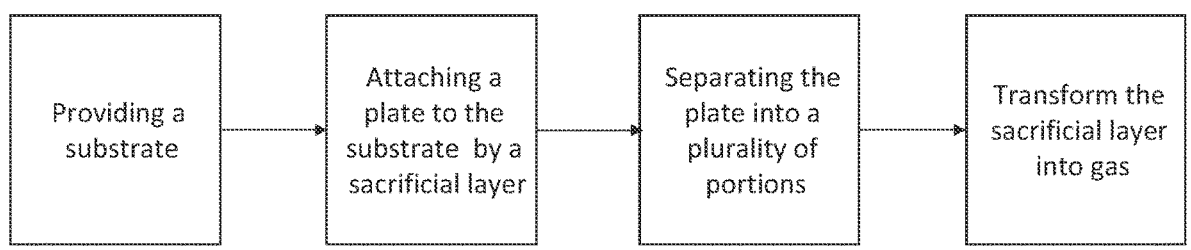
FIG. 12 is a flow chart of process steps in accordance with a non-limiting embodiment of the invention.

With reference to FIG. 1 and the flow chart of FIG. 12, a rigid substrate 2 is provided, for example a sapphire substrate.

This substrate 2 is covered with a sacrificial layer 3.

This sacrificial layer is composed of more than 99% by mass of polymer molecules, for example polypropylene carbonate molecules.

This polymer material 3 can, for example, be applied on the substrate by the same usual methods of application of a photosensitive resin.

The polymer can be applied in solution in a solvent, the solvent evaporating rapidly after the application.

The evaporation of the solvent can be terminated by an annealing at a temperature less than the decomposition temperature of the polypropylene carbonate.

A plate 1 is deposited on this polymer material 3, which is firmly attached by applying a mechanical pressure perpendicular to the plate, at a temperature above the glass transition temperature of the sacrificial material.

As illustrated in the figures, this plate can comprise interconnections 7 and a metallisation layer 8 (ground plane).

The material of the solid layer 3, ensures the attachment of the plate 1 to the substrate 2, as illustrated by FIG. 2.

The plate 1 has been obtained from a wafer, for example of GaAs, on which has been deposited, in known manner, elements constituting an integrated semiconductor circuit, such as a barrier layer, a channel layer, drains, sources, etc., which are not shown here.

In this example, the plate 1 is in contact with the sacrificial layer 3 via its backside.

In this example, the plate 1 can, for example, have a thickness of order of 50 μm, and be intended to be used as components which process signals with frequencies of 300 GHz, which require that the thickness is not larger, in order to avoid stray transmission modes inside the chip.

With reference to FIG. 2, which shows the plate attached to the substrate 2 before dicing, it is relatively easy to carry out transport and measurement operations by means of a probe, because the thickness of the substrate 2 compensates for the low thickness of the plate 1 and provides the mechanical strength necessary in order to considerably limit the risk of damage.

These measures can sometimes be accompanied by increases in temperature, under conditions such that the sacrificial layer remains intact, in which case it is judicious to choose a substrate having an expansion coefficient close to that of the plate. In this example, the substrate is a sapphire substrate and the plate is a GaAs plate, but a substrate could be provided that is produced from the same material as that of the wafer from which the plate originates.

With reference to FIG. 3, in order to prepare the dicing step, the photoresist material 4 is deposited so as to define rectilinear openings 5, corresponding to futures dicing.

Conventionally, rectilinear openings are provided extending perpendicularly to the plane of the drawing, such as those 5 visible in the figure, and other rectilinear openings parallel to one another and crossing the rectilinear openings extending perpendicular to the plane of the sheet.

With the methods of dicing by etching or by laser, these openings are not compulsorily rectilinear.

This dicing grid can thus define thousands of future components on a same plate.

A plasma is then applied, so as to etch the plate 1 at the dicing locations 5, as illustrated by FIG. 4. An RIE ("Reactive ion etching") type etching can be used.

The plate 1 is then diced into a plurality of plate portions 1' each corresponding to an individual component. In this example, these portions 1' rest on a same sacrificial layer 3.

By contrast, the substrate is not diced and remains in one piece.

A second plasma, of dioxygen, can then be applied, in order to remove the mask 4 and to hollow out the sacrificial layer at the locations defined by the openings 5, as illustrated by FIG. 5.

The temperature is then increased, for example to 270° C., so that the polymers of the sacrificial layer 3 decompose and evaporate, as illustrated in FIG. 6.

The components 1' then adhere to the substrate 2 through relatively weak forces (probably Van der Waals forces), thus allowing the assembly to be moved while preserving the positions of the components 1" on the substrate.

A tool 6 providing a light vacuum suction makes it possible to easily detach the components 1' from the substrate 2.

In the embodiment of FIGS. 7 to 11, grooves 19 are initially defined, for example on a front side of a thick plate 11.

On this front side, interconnections 17 have already been obtained by processes known from the prior art, which symbolise the presence of an integrated circuit.

These grooves 19 can be hollowed out by processes that are known per se, for example by etching, by laser or by mechanical means.

The locations of the grooves correspond to the edges of the future chips.

These grooves will be hollowed out to a greater depth than the final thickness of the chips.

Figure 7:
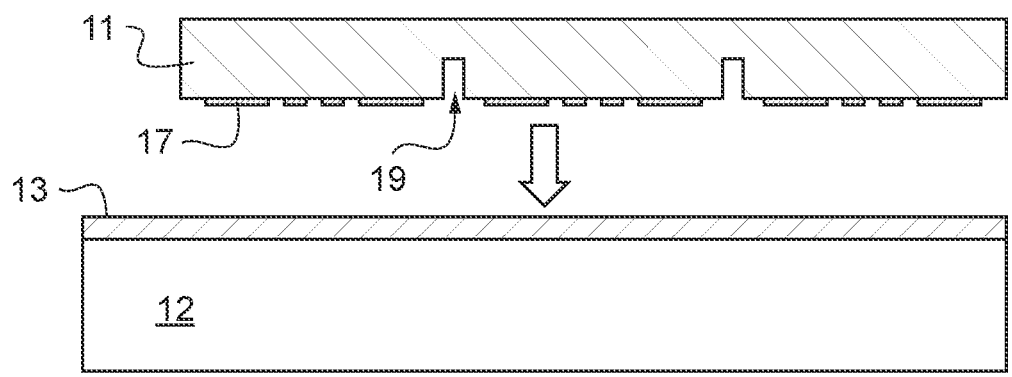
Figure 8:
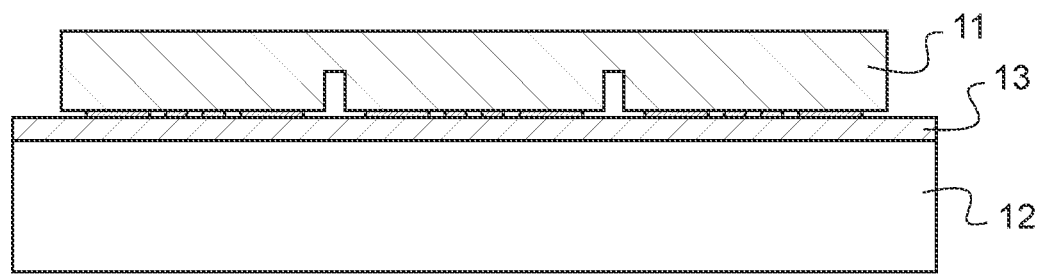
Figure 9:
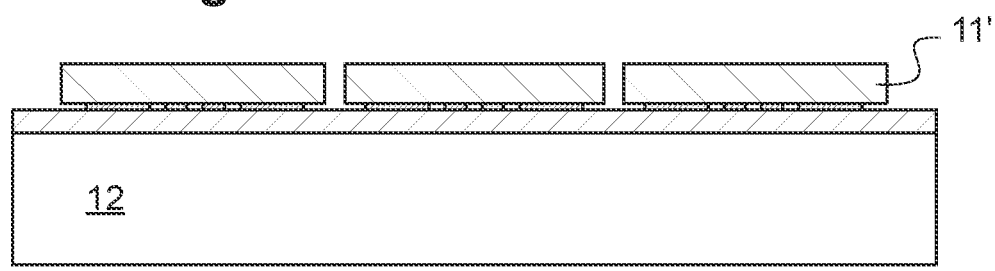

Then, as illustrated in FIGS. 7 and 8, the plate 11 is attached via its front side on the substrate 12 by means of a sacrificial layer 13.

Holes can then optionally be hollowed out through the substrate 12.

The plate 11 is then thinned to the final thickness of the chips, which has the effect of separating the chips. It is possible, for example, to polish the plate 11 until the grooves 19 are reached.

The plate portions 11' can then have a thickness of order 50 μm or 100 μm.

After cleaning and optional technological steps such as the hollowing of via-holes through the chips and the metallisation of the backside of the chips (see reference sign 18 in FIG. 10), annealing is performed at the transformation temperature (or above) of the sacrificial layer, in order to detach the chips from the substrate.

As shown in FIG. 11, the sacrificial layer has then disappeared and the chips 11" adhere lightly to the substrate 12.

In an alternative embodiment that is not shown, it is possible to etch via-holes before the thinning step. It would then be judicious to clean the via-holes once the thinning is performed.

In an alternative embodiment that is not shown, the plate can be grooved on its backside and attached to the substrate by its backside. Once thinned, it is possible to carry out various processes, for example depositing of layers, etchings, etc., and which is all the easier when the substrate is rigid because then the alignments are controlled.

The invention claimed is:

1. A process for back end processing of a plate in order to obtain a plurality of individual detached electrical, optical or optoelectronic components, comprising:
   a) providing a substrate;
   b) attaching the plate to the substrate by means of a sacrificial layer located between the plate and the substrate, the sacrificial layer being in contact with the plate and with the substrate, the sacrificial layer being made from at least one material that is in a solid state at ambient temperature and ambient pressure, the sacrificial layer having a transformation temperature into one or more gaseous compounds at ambient pressure of between 80° C. and 600° C.;

c) separating the plate that is attached to the substrate into a plurality of plate portions that are attached to the substrate, the substrate remaining as a single piece; and d) increasing a temperature and/or reducing a surrounding pressure to a sufficiently high temperature and/or a sufficiently low pressure, respectively, such that the sacrificial layer attached to the plurality of plate portions is transformed into one or more gaseous compounds and the plurality of plate portions remain attached directly to the substrate.

2. The process according to claim 1, wherein the separation step c) includes a step of dicing the plate attached to the substrate by the sacrificial layer.

3. The process according to claim 2, wherein the plate is diced by etching.

4. The process according to claim 3, wherein the etching is plasma etching.

5. The process according to claim 2, wherein the dicing is carried out or induced by means of a laser.

6. The process according to claim 2, wherein the dicing is carried out or induced mechanically.

7. The process according to claim 1, wherein,
prior to step b) of attaching the plates to the substrate, grooves are hollowed out on one face of the plate, referred to as a grooved face, said grooves not reaching a face of the plate that is opposite to said grooved face,
during the step b), said grooved face is in contact with the sacrificial layer,
during the step c) of separating the plate, the plate is thinned via the face opposite said grooved face, at least until the grooves are reached.

8. The process according to claim 1, wherein the sacrificial layer comprises at least 70% by mass of crude polymers.

9. The process according to claim 8, wherein said crude polymers consist of more than 70% by mass of polypropylene carbonate molecules, other polycarbonate molecules and/or polynorbornene molecules.

10. The process according to claim 1, wherein the plate is obtained from a wafer essentially comprising silicon Si, germanium Ge, gallium arsenide GaAs, indium arsenide InAs, indium phosphide InP, gallium phosphide GaP, gallium antimonide GaSb, indium antimonide InSb, silicon carbide SiC, gallium nitride GaN, aluminium nitride AlN, and/or diamond.

11. The process according to claim 1, wherein the sacrificial layer has a transformation temperature to the gaseous state at 100 kPa of between 80° C. and 600° C.

12. The process according to claim 1, wherein the attachment of the plate to the substrate via the sacrificial layer is carried out at a temperature greater than a glass transition temperature of the material or materials of the sacrificial layer.

13. The process according to claim 1, wherein the plate and the substrate have expansion coefficients that are equal or vary by less than 5%.

14. The process of claim 6, wherein the dicing is carried out using a saw blade.

15. The process according to claim 3, wherein the dicing is carried out or induced by means of a laser.

16. The process according to claim 4, wherein the dicing is carried out or induced by means of a laser.

17. The process according to claim 3, wherein the dicing is carried out or induced mechanically.

18. The process according to claim 4, wherein the dicing is carried out or induced mechanically.

19. The process according to claim 2, wherein,
prior to step b) of attaching the plates to the substrate, grooves are hollowed out on one face of the plate, referred to as a grooved face, said grooves not reaching a face of the plate that is opposite to said grooved face,
during the step b), said grooved face is in contact with the sacrificial layer,
during the step c) of separating the plate, the plate is thinned via the face opposite said grooved face, at least until the grooves are reached.

20. The process according to claim 1, wherein the sacrificial layer has a transformation temperature to the gaseous state at 100 kPa of between 230° C. and 350° C.

* * * * *